United States Patent
Sakai et al.

[11] Patent Number: 5,858,884
[45] Date of Patent: Jan. 12, 1999

[54] NONWOVEN FABRIC CLOTH SUBSTRATE FOR PRINTED WIRING BOARDS, AND PREPREG USING THE SAME

[75] Inventors: Masayuki Sakai; Hideo Hatanaka, both of Osaka; Masahide Tsukamoto, Nara; Seiichi Nakatani, Osaka; Masayuki Okano, Osaka; Tamao Kojima, Osaka, all of Japan

[73] Assignee: Matsushita Electric Industrial Co., Ltd., Osaka, Japan

[21] Appl. No.: 856,548

[22] Filed: May 15, 1997

[30] Foreign Application Priority Data

May 15, 1996 [JP] Japan .................................. 8-120630

[51] Int. Cl.$^6$ ................................ C08J 5/24; C08J 5/04; H05K 1/03

[52] U.S. Cl. ............................ 442/169; 442/58; 442/65; 442/117

[58] Field of Search ............................ 428/901; 442/169, 442/58, 65, 117

[56] References Cited

U.S. PATENT DOCUMENTS

| | | | |
|---|---|---|---|
| 3,391,056 | 7/1968 | Robinson, Jr. | 442/65 |
| 3,855,047 | 12/1974 | Groff | 442/117 |
| 4,686,663 | 8/1987 | Kühn | 369/46 |
| 4,687,681 | 8/1987 | Siemon et al. | 442/169 |
| 4,698,267 | 10/1987 | Tokarsky | 428/474.4 |
| 4,729,921 | 3/1988 | Tokarsky | 428/288 |
| 5,002,637 | 3/1991 | Toyoshima et al. | 162/137 |
| 5,049,434 | 9/1991 | Uno et al. | 428/901 |
| 5,173,359 | 12/1992 | Toyoshima et al. | 428/229 |
| 5,783,039 | 7/1998 | Murayama | 442/169 |

FOREIGN PATENT DOCUMENTS

| | | |
|---|---|---|
| 0 768 334 | 4/1997 | European Pat. Off. . |
| Sho 62-261190 | 11/1987 | Japan . |
| Sho 62-273792 | 11/1987 | Japan . |
| Sho 62-274688 | 11/1987 | Japan . |
| Sho 62-274689 | 11/1987 | Japan . |
| 7-115268 | 5/1995 | Japan . |

*Primary Examiner*—William Krynski
*Assistant Examiner*—Cathy F. Lam
*Attorney, Agent, or Firm*—Merchant, Gould, Smith, Edell, Welter & Schmidt, P.A.

[57] ABSTRACT

A nonwoven fabric cloth substrate for printed wiring boards containing aromatic polyamide fibers and having a 0.7–1.0 dynamic elastic modulus ratio (E' (250° C.)/E' (30° C.)) and a 0.05 or less loss tangent (Tanδ) peak value at 30°–250° C., and a prepreg and a printed wiring board using the nonwoven fabric cloth substrate.

7 Claims, 1 Drawing Sheet

NONWOVEN FABRIC CLOTH SUBSTRATE FOR PRINTED WIRING BOARDS, AND PREPREG USING THE SAME

FIELD OF THE INVENTION

The present invention relates to a printed wiring board useful for electric devices. More specifically, the present invention relates to a nonwoven fabric cloth substrate with superior insulating properties which is useful for printed wiring boards and contains aromatic polyamide fibers, and a prepreg and a printed wiring board comprising the nonwoven fabric cloth substrate.

BACKGROUND OF THE INVENTION

With the recent rapid improvement in the performance of electric devices, more functional and economical printed wiring boards are needed. For substrate materials, the combination of economical glass fibers having superior electric insulating properties, strength, etc. with an epoxy resin is generally used. However, the use of glass fibers cannot keep up with recent trends, such as the increase in wiring density and the development of chip mounting. That the use of copper-clad laminates (or aramid substrates) in which an aromatic polyamide fiber nonwoven fabric cloth is applied as a substrate has been suggested (see, for intance, U.S. Pat. No. 4,729,921, Kokai (Laid-open) Japanese Patent Application No. Sho 60-52937, No. Sho 61-160500, No. Sho 62-261190, No. Sho 62-273792, No. Sho 62-274688 and No. Sho 62-274689).

Because of characteristics such as low expansion, low dielectric constants and light weight, the application of the aramid substrates to electric devices has been examined for public, industrial and defense purposes.

However, the above-mentioned aramid substrate is not useful because it has a substantial amount of impure ions and a large absorption factor. The previously known aramid substrates have a poor insulating reliability due to the lack of adherence between the nonwoven fabric cloth and impregnated resin. The aramid substrate is also susceptable to mechanical deformation such as by warping and twisting. In order to lessen these problems, improvements in aromatic polyamide fibers, use of a binder for the aromatic polyamide fibers, and the nonwoven fabric cloth surface quality and texture have been tested. Furthermore, the development of impregnated resins has also been tested.

SUMMARY OF THE INVENTION

In order to solve the conventional problems mentioned above, the present invention provides an improved nonwoven fabric cloth substrate which has little mechanical deformation and is useful for printed wiring boards, and a prepreg and a printed wiring board using the improved nonwoven fabric cloth substrate.

In order to achieve the objects mentioned above, the improved nonwoven fabric cloth substrate for printed wiring boards of the present invention comprises aromatic polyamide fibers. The ratio of dynamic elastic moduli at 250° C. and 30° C. (E' (250° C.)/E' (30° C.)) of the improved nonwoven fabric cloth substrate is 0.7–1.0, and the peak value of loss tangent (Tan$\delta$) in the range of 30°–250° C. is 0.05 or less. As a result of these improved characteristics, the mechanical deformation of the nonwoven fabric cloth substrate is reduced, and the deformation of the substrate or the unevenness of the flow characteristic of an impregnated resin is prevented in the temperature range of the manufacturing process and reliability test, thereby controlling warping and twisting.

The improved nonwoven fabric cloth is preferably treated by a heat treatment at 250°–400° C. and/or a dipping treatment in an alcohol solvent. As a result of this treatment, adherence between an impregnated resin and the aromatic polyamide fibers in a printed wiring board (final product) is improved, thereby increasing insulating reliability.

It is also preferable that the nonwoven fabric cloth is further treated by at least one treatment selected from the group consisting of a silane coupling agent treatment, a corona treatment and an ozone treatment after carrying out the heat treatment and/or the dipping treatment.

It is preferable that the aromatic polyamide fibers are para-type aramid fibers including poly(p-phenylene terephthalamide) such as "KEVLAR" (trademark) manufactured by E. I. DuPont and/or meta-aramid fibers including poly(m-phenylene isophthalamide) such as "NOMEX" (trademark) manufactured by E. I. DuPont.

It is also preferable that the aromatic polyamide fibers are 0.5–6.0 deniers in size and have 2–14 mm fiber length.

It is preferable that the nonwoven fabric cloth substrate is manufactured by a wet paper method. The wet papermaking method well known by U.S. Pat. No. 4,729,921, column 5, lines 26–51. In the method, the nonwoven cloth fabric substrate is manufactured by dispersing short fibers together with coupling substances (e.g. aramid fibril, aramid pulp, and epoxy resin) in water, scoop them up with a net to make a sheet having uniform thickness, and compress the sheet by a calendar roll.

It is also preferable that the nonwoven fabric cloth substrate has 30–120 g/m$^2$ dry weight.

It is further preferable that the nonwoven fabric cloth substrate is 50–300 $\mu$m thick.

The prepreg of the present invention comprises the nonwoven fabric cloth substrate which is impregnated with a resin varnish and is then dried.

It is preferable that the resin varnish comprises an epoxy resin such as trade name "YL-6090" by YUKA SHELL EPOXY Co.

It is also preferable that the resin varnish comprises a phenol resin such as trade name "YLH-129", which is a novolak phenol resin, by YUKA SHELL EPOXY Co.

It is further preferable that the prepreg contains the resin varnish at 35–65 wt. % after being dried.

It is preferable that the prepreg is 50–200 $\mu$m thick.

It is preferable that the nonwoven fabric cloth substrate is impregnated with the resin varnish and is then dried after being treated with the heat treatment and/or the dipping treatment.

It is also preferable that the nonwoven fabric cloth substrate is impregnated with the resin varnish and is then dried after the nonwoven fabric cloth is treated with the heat treatment and/or the dipping treatment (first treatment) and after the first treatment is treated with the silane coupling agent treatment, the corona treatment and/or the ozone treatment (second treatment).

The printed wiring board of the present invention comprises a prepreg in which the nonwoven fabric cloth substrate impregnated with a resin varnish and then dried is applied.

By applying an effective surface treatment method which can improve bonding strength between a substrate and a resin interface, insulating properties improve significantly.

The heat treatment and the dipping treatment are effective to crystallize a fiber surface and remove impurities, thus improving adherence between the substrate and the impregnated resin as well as insulating reliability. Furthermore, the silane coupling agent treatment, the corona treatment and the ozone treatment (second treatment) improve the compatibility of the substrate with the impregnated resin, thus increasing adherence between the substrate and the impregnated resin and also insulating reliability.

DETAILED DESCRIPTION OF THE INVENTION

Figure 1:
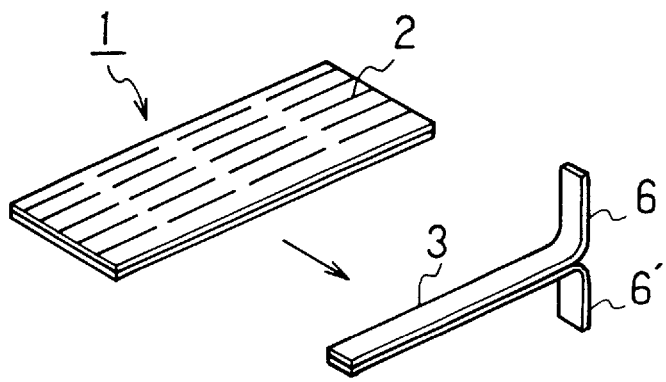
FIG. 1 is an illustration explaining how to prepare samples for the adherence peeling strength measurement conducted in one embodiment of this invention.

The embodiments of the present invention will be described below.

EXAMPLE 1

1. Preparation of an Aromatic Polyamide Fiber Nonwoven Fabric Cloth Substrate

A nonwoven fabric cloth was prepared by a wet method from para-based aromatic polyamide fibers ("KEVLAR" (trademark) manufactured by E. I. DuPont; size: 2.2 deniers; fiber length: 6 mm). After the nonwoven fabric cloth was compressed by using a calendar roll, a sheet which was heat-treated for ten minutes at 250° C. was used. The sheet used in this Example was Thermount −230, −240 and −244 by E. I. DuPont. The dried nonwoven fabric cloth had 70 g/m² weight and 120 μm thickness after the treatments.

2. Impregnation Process of a Resin Varnish

A varnish was prepared by mixing and dissolving the following materials:

| | |
|---|---|
| Brominated bisphenol A epoxy resin (amount of bromine; 23%: epoxy equivalent; 270) | 35.0 weight parts |
| Trifunctional epoxy resin (amount of bromine; 23%: epoxy equivalent; 270) | 35.0 weight parts |
| Novolak phenol resin (equivalent of hydroxyl groups; 120) | 30.0 weight parts |
| Carbonyl diimidazole | 0.1 weight part |
| Methylethylketone | 66.6 weight parts. |

The above mixture of the brominated bisphenol A epoxy resin and the trifunctional epoxy resin is provided by YUKA SHELL EPOXY Co. as YL-6090, and the novolak phenol resin is also provided by YUKA SHELL EPOXY Co. as YHL-129.

Varnish was prepared by dissolving and mixing the above material. The vanish was impregnated into the nonwoven fabric cloth substrate and heated to dry in an oven in order to remove the solvent and to proceed the reaction of the impregnated resin, and thus, a prepreg was obtained. The time for impregnation is about from 10 seconds to two minutes. Heat-dry is conducted at about 102° to 160° C. for from three to ten minutes.

The varnish was impregnated into the nonwoven fabric cloth so as to set the total amount of the impregnated resin at 50±1 wt. % in a prepreg condition, thereby preparing a prepreg after drying the nonwoven fabric cloth at 140° C. for five minutes. For calculating the amount of the impregnated resin, the amount of the impregnated resin (R) is found by the difference of the dry prepreg weight (P) after the resin impregnation from the weight of the nonwoven fabric cloth substrate before the impregnation. The value is then calculated as a percentage of the value (R) to the dry prepreg weight (P). The amount of the resin controlled by varying conditions such as the solid concentration of the resin varnish and the impregnation time.

3. Laminating Process

After impregnating the resin varnish, electrolytic copper foils at 18 μm thickness were laminated on both surfaces of the prepreg, and were compressed with heat by press machine treatment at 180° C. and with 50 kg/cm pressure press machine treatment for 60 minutes so as to provide a copper-clad laminate.

EXAMPLE 2

A prepreg and a copper-clad laminate were manufactured as in Example 1, except that the aromatic polyamide fiber nonwoven fabric cloth described in Example 1 was heat-treated at 300° C. for ten minutes.

EXAMPLE 3

A prepreg and a copper-clad laminate were manufactured as in Example 1, except that the aromatic polyamide fiber substrate nonwoven fabric cloth described in Example 1 was heat-treated at 400° C. for ten minutes.

COMPARATIVE EXAMPLE 1

A prepreg and a copper-clad laminate were manufactured as in Example 1, except that the aromatic polyamide fiber nonwoven fabric cloth described in Example 1 was not heat-treated.

COMPARATIVE EXAMPLE 2

A prepreg and a printed wiring board were manufactured as in Example 1, except that the aromatic polyamide fiber nonwoven fabric cloth described in Example 1 was heat-treated at 450° C. for ten minutes.

EXAMPLE 4

A prepreg and a copper-clad laminate were manufactured as in Example 1, except that the aromatic polyamide fiber nonwoven fabric cloth described in Example 1 was dipped in methanol for about one minute.

EXAMPLE 5

A prepreg and a copper-clad laminate were manufactured as in Example 1, except that the aromatic polyamide fiber nonwoven fabric cloth described in Example 1 was dipped in ethanol for about one minute.

EXAMPLE 6

A prepreg and a copper-clad laminate were manufactured as in Example 1, except that the aromatic polyamide fiber nonwoven fabric cloth described in Example 1 was treated with heat at 300° C. for ten minutes and was then dipped in methanol for about one minute.

EXAMPLE 7

A prepreg and a copper-clad laminate were manufactured as in Example 1, except that the aromatic polyamide fiber nonwoven fabric cloth described in Example 1 was treated with heat at 300° C. for ten minutes and was then treated with a silane coupling agent. Such a silane coupling agent can be selected from the group consisting of γ-glycidoxypropyl trimethoxysilane whose trade name is A-187 by Nippon Unicar Company Limited, N-β-(aminoethyl)-γ-aminopropyl trimethoxysilane whose trade name is A-1120 by Nippon Unicar Company Limited, and γ-ureidopropyl triethoxysilane whose trade name is A-1160 by Nippon Unicar Company Limited. In this Example, γ-glycidoxypropyl trimethoxysilane was used. γ-glycidoxypropyl trimethoxysilane of concentration of 1 weight % was dissolved in methanol, provided into a stainless steel vat, in which the nonwoven fabric cloth substrate was impregnated for one minute.

EXAMPLE 8

A prepreg and a copper-clad laminate were manufactured as in Example 1, except that the aromatic polyamide fiber nonwoven fabric cloth described in Example 1 was treated with heat at 300° C. for ten minutes and then a corona treatment was carried out on the nonwoven fabric cloth at 100W·min./m² by using a corona discharge treatment device manufactured by KASUGA ELECTRIC WORKS LTD.

EXAMPLE 9

A prepreg and a copper-clad laminate were manufactured as in Example 1, except that the aromatic polyamide fiber nonwoven fabric cloth described in Example 1 was treated with heat at 300° C. for ten minutes and then an ozone treatment were carried out on the nonwoven fabric cloth at 100W for five minutes by using a QOL-25SY device manufactured by AI GRAPHICS.

EXAMPLE 10

A prepreg and a copper-clad laminate were manufactured as in Example 1, except that the aromatic polyamide fiber nonwoven fabric cloth described in Example 1 was dipped in methanol and then treated with a silane coupling agent.

EXAMPLE 11

A prepreg and a copper-clad laminate were manufactured as in Example 1, except that the aromatic polyamide fiber nonwoven fabric cloth described in Example 1 was dipped in methanol and a corona treatment was then carried out on the cloth.

EXAMPLE 12

A prepreg and a copper-clad laminate were then manufactured as in Example 1, except that the aromatic polyamide fiber nonwoven fabric cloth described in Example 1 was dipped in methanol and an ozone treatment was then carried out on the cloth.

In an alternative embodiment, the treatments may be carried out during the process of preparing a nonwoven fabric cloth substrate as described in Example 1. In this case, the first and second treatments are not carried out in the process of manufacturing a prepreg.

Adherence strength between the aramid fiber nonwoven fabric cloth substrate and the matrix resin (bonding strength between layers) as well as the conductivities of water extract of the copper-clad laminates of Examples 1–12 and Comparative Examples 1–2 are shown in the following Tables 1 and 2. The adherence strength has a direct influence on insulating reliability while the conductivity is an indicator of the amount of water soluble impurities.

TABLE 1

|  | (1) | (2) | (3) | (4) |
|---|---|---|---|---|
| Example 1 | 250 | None | 0.65 | 80 |
| Example 2 | 300 | None | 0.75 | 60 |
| Example 3 | 400 | None | 0.75 | 50 |
| Comparative Ex. 1 | None | None | 0.50 | 110 |
| Comparative Ex. 2 | 450 | None | 0.45 | 120 |
| Example 4 | None | Methanol | 0.60 | 100 |
| Example 5 | None | Ethanol | 0.60 | 100 |
| Example 6 | 300 | Methanol | 0.85 | 55 |

(1) Heat treatment temperature (°C.)
(2) Dipping treatment
(3) Adherence strength (kg/cm)
(4) Conductivity (µs/cm)

TABLE 2

|  | (1) | (2) | (5) | (3) |
|---|---|---|---|---|
| Example 7 | 300 | None | Silane coupling | 0.85 |
| Example 8 | 300 | None | Corona | 0.80 |
| Example 9 | 300 | None | Ozone | 0.80 |
| Example 10 | None | Methanol | Silane coupling | 0.70 |
| Example 11 | None | Methanol | Corona | 0.70 |
| Example 12 | None | Methanol | Ozone | 0.70 |

(1) Heat treatment temperature (°C.)
(2) Dipping treatment
(3) Adherence strength (kg/cm)
(5) Additional treatment The following is analysis methods relating to the Tables 1 and 2.

Figure 2:
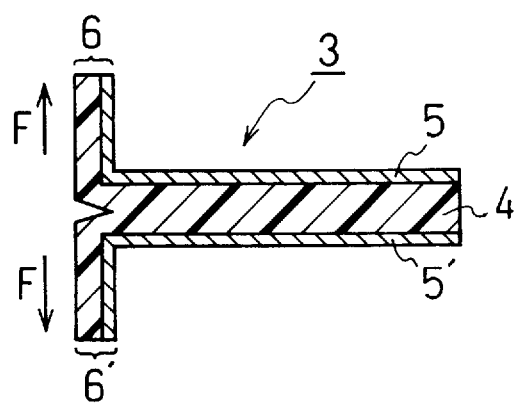
FIG. 2 is an illustration explaining how to measure the adherence peeling strength in one embodiment of this invention.

Adherence peeling strength (kg/cm): As shown in FIG. 1, the heat-pressed copper-clad laminate 1 was cut along the broken lines 2 to be 1 cm wide and 10 cm long, so that a sample 3 was prepared. The sample 3 was cut by using a cutter in the middle of the layers to 2 cm from one end of the sample 3, so that holding portions (6, 6') were made. Next, as shown in FIG. 2, a peel test was carried out by using a tensile tester: the holding portions (6, 6') were held and stretched in the (F, F) directions. In FIG. 2, 4 is a substrate layer comprising an aramid fiber nonwoven fabric cloth substrate and a matrix resin, while 5 and 5' are copper layers. A scanning electron microscope (SEM) was used to measure adherence strength by detecting whether or not the aramid fiber nonwoven fabric cloth substrate was peeled off from the matrix resin.

Conductivity (µS/cm): a hardened substrate was prepared by removing copper foils from a thermally pressed copper-clad laminate, and the substrate was pulverized into a powder of less than 60 mesh. Five grams of the powder and 50 ml of pure water were added into a 100 ml sealing container made of polytetrafluoroethylene ("Teflon" (trademark) manufactured by Dupont), and were treated at 121° C. for twenty four hours. The conductivity of the solution was then measured by a conductivity meter.

Table 1 shows the effects of the heat treatment and the dipping treatment. The adherence strength was increased in samples that were heat treated. The preferred treatment temperature was from 250° C. to 400° C. When the temperature was 450° C., adherence strength declined. The heat treatment can also effectively decrease conductivities. Since heat likely promotes fiber crystallization, this prevents the elution of impurities from the fibers. In other words, this characteristic is effective so as to prevent poor insulation in preparing printed wiring boards. Like the heat treatment, the dipping treatment with methanol or ethanol also improved adherence strength. The dipping treatment may be carried out along with the heat treatment. The dipping treatment can clean the surface of fibers, thus increasing adherence strength. Other solvents, such as ethanol, acetone and methylethylketone, may also be used for the dipping treatment.

Table 2 shows adherence strength when a second treatment is carried out in addition to the heat or the dipping first treatment. The silane coupling treatment, corona treatment and ozone treatment increase adherence strength. These treatments are generally applied so as to improve adherence strength, and are highly effective.

EXAMPLE 13

1. Preparation of an Aromatic Polyamide Fiber Nonwoven Fabric Cloth Substrate

A nonwoven fabric cloth was prepared by a wet method from para-type aromatic polyamide fibers (96 wt. %; "KEVLAR" (trademark) manufactured by Dupont; size: 2.2 deniers; fiber length: 6 mm) and meta-type aromatic polyamide fibers (4 wt. %; "NOMEX" (trademark) manufactured by Dupont; size 2.2 deniers; fiber length: 6 mm). After carrying out a paper treatment, a calender treatment was carried out on the nonwoven fabric cloth at 300° C. with 200 kg/cm pressure. The dry weight of the nonwoven fabric cloth was 70 g/m$^2$, and the thickness was 100 $\mu$m.

2. Impregnation Process of a Resin Varnish

A varnish was prepared by mixing and dissolving the following materials:

| | |
|---|---|
| Brominated bisphenol A epoxy resin (amount of bromine: 23%; epoxy equivalent: 270) | 35.0 weight parts |
| Trifunctional epoxy resin (amount of bromine: 23%; epoxy equivalent: 270) | 35.0 weight parts |
| Novolak phenol resin (equivalent of hydroxyl groups) | 30.0 weight parts |
| Carbonyl diimidazole | 0.1 weight part |
| Methylethylketone | 66.6 weight parts. |

The varnish was impregnated into the nonwoven fabric cloth so as to set the total amount of impregnated resin at 50±1 wt. % in a prepreg condition. A prepreg was prepared by drying the nonwoven fabric cloth at 140° C. for five minutes.

3. Laminating Process

After being dipped in the resin varnish, the prepreg was laminated with electrolytic copper foils at 18 $\mu$m thickness on both surfaces, and was then thermally compressed at 180° C. and with 50 kg/cm$^2$ for 60 minutes so as to prepare a copper-clad laminate.

EXAMPLE 14

A prepreg and a copper-clad laminate were manufactured as in Example 13, except that a water-dispersed epoxy resin binder was added to the aromatic polyamide fibers at 1 wt. %. The trade name of the binder is Dickfine EN-0270 manufactured by DAINIPPON INK & CHEMICALS, INC.

EXAMPLE 15

A prepreg and a copper-clad laminate were manufactured as in Example 13, except that a water-diespersed epoxy resin binder described in Example 14 was added to the aromatic polyamide fibers at 3 wt. %.

COMPARATIVE EXAMPLE 3

A prepreg and a copper-clad laminate were manufactured as in Example 13, except that a water-dispersed epoxy resin binder described in Example 14 was added to the aromatic polyamide fibers at 5 wt. %.

COMPARATIVE EXAMPLE 4

A prepreg and a copper-clad laminate were manufactured as in Example 13, except that a water-dispersed epoxy resin binder described in Example 14 was added to the aromatic polyamide fibers at 7 wt. %.

EXAMPLE 16

A prepreg and a copper-clad laminate were manufactured as in Example 13, except that the nonwoven fabric cloth prepared as in Example 13 was treated with heat at 250° C. for ten minutes after the calender treatment.

EXAMPLE 17

A prepreg and a copper-clad laminate were manufactured as in Example 13, except that the nonwoven fabric cloth prepared as in Example 13 was treated with heat at 300° C. for ten minutes after the calender treatment.

EXAMPLE 18

A prepreg and a copper-clad laminate were manufactured as in Example 13, except that the nonwoven fabric cloth prepared as in Example 13 was treated with heat at 400° C. for ten minutes after the calender treatment.

COMPARATIVE EXAMPLE 5

A prepreg and a copper-clad laminate were manufactured as in Example 1, except that the nonwoven fabric cloth prepared as in Example 13 was treated with heat at 450° C. for ten minutes after the calender treatment.

EXAMPLE 19

A prepreg and a copper-clad laminate were manufactured as in Example 13, except that the nonwoven fabric cloth prepared as in Example 13 was dipped in methanol after the calender treatment.

EXAMPLE 20

A prepreg and a copper-clad laminate were manufactured as in Example 13, except that the nonwoven fabric cloth prepared as in Example 13 was dipped in ethanol after the calender treatment.

EXAMPLE 21

A prepreg and a copper-clad laminate were manufactured as in Example 13, except that the nonwoven fabric cloth prepared as in Example 13 was treated with heat at 300° C. for ten minutes and was then dipped in methanol after the calender treatment.

EXAMPLE 22

A prepreg and a copper-clad laminate were manufactured as in Example 13, except that the nonwoven fabric cloth prepared as in Example 13 was treated with heat at 300° C. for ten minutes and was then treated with a silane coupling agent after the calender treatment.

EXAMPLE 23

A prepreg and a copper-clad laminate were manufactured as in Example 13, except that the nonwoven fabric cloth prepared as in Example 13 was treated with heat at 300° C. for ten minutes and a corona treatment was then carried out on the cloth after the calender treatment.

EXAMPLE 24

A prepreg and a copper-clad laminate were manufactured as in Example 13, except that the nonwoven fabric cloth prepared as in Example 13 was treated with heat at 300° C. for ten minutes and was then treated with ozone after the calender treatment.

EXAMPLE 25

A prepreg and a copper-clad laminate were manufactured as in Example 13, except that the nonwoven fabric cloth prepared as in Example 13 was dipped in methanol and was then treated with a silane coupling agent after the calender treatment.

EXAMPLE 26

A prepreg and a copper-clad laminate were manufactured as in Example 13, except that the nonwoven fabric cloth prepared as in Example 13 was dipped in methanol and a corona treatment was then carried out on the cloth after the calender treatment.

EXAMPLE 27

A prepreg and a copper-clad laminate were manufactured as in Example 13, except that the nonwoven fabric cloth prepared as in Example 13 was dipped in methanol and was then treated with ozone after the calender treatment.

In an alternative embodiment, the first and second treatments may be carried out when preparing the nonwoven fabric cloth as described in Example 1. When the treatments are carried out in the preparation processe of the nonwoven fabric cloth, they are not needed in the process of manufacturing a prepreg.

The following Tables 3–5 show dynamic viscoelasticity (dynamic elastic modulus ratio and loss tangent), degree of warp, adherence strength (bonding strength between layers) and water extract conductivity of the copper-clad laminates of the examples and the comparative examples mentioned above.

TABLE 3

Dynamic Viscoelasticity

|  | E1/E2 | Tanδ | A | B | C |
|---|---|---|---|---|---|
| Example 13 | 1.00 | 0.02 | 1.0 | 0.75 | 100 |
| Example 14 | 0.90 | 0.03 | 1.5 | 0.75 | 105 |
| Example 15 | 0.70 | 0.05 | 2.0 | 0.80 | 110 |
| Comparative Ex. 3 | 0.55 | 0.07 | 4.0 | 0.85 | 120 |
| Comparative Ex. 4 | 0.40 | 0.10 | 6.0 | 0.85 | 130 |

A Degree of warp (mm)
B Adherence strength (kg/cm)
C Conductivity (μm/cm)

TABLE 4

|  | (1) | (2) | A | B | C |
|---|---|---|---|---|---|
| Example 16 | 250 | None | 1.0 | 0.85 | 100 |
| Example 17 | 300 | None | 1.0 | 0.90 | 75 |
| Example 18 | 400 | None | 1.0 | 0.90 | 65 |
| Comparative Ex. 5 | 450 | None | 3.0 | 0.60 | 120 |

TABLE 4-continued

|  | (1) | (2) | A | B | C |
|---|---|---|---|---|---|
| Example 19 | None | Methanol | 1.0 | 0.85 | 100 |
| Example 20 | None | Ethanol | 1.0 | 0.85 | 100 |
| Example 21 | 300 | Methanol | 1.0 | 0.95 | 70 |

(1) Heat treatment temperature (°C.)
(2) Dipping treatment
A Degree of warp (mm)
B Adherence strength (kg/cm)
C Conductivity (μm/cm)

TABLE 5

|  | (1) | (2) | (5) | A | B |
|---|---|---|---|---|---|
| Example 22 | 300 | None | Silane coupling | 1.0 | 1.05 |
| Example 23 | 300 | None | Corona | 1.0 | 1.00 |
| Example 24 | 300 | None | Ozone | 1.0 | 1.00 |
| Example 25 | None | Methanol | Silane coupling | 1.0 | 1.05 |
| Example 26 | None | Methanol | Corona | 1.0 | 1.00 |
| Example 27 | None | Methanol | Ozone | 1.0 | 1.00 |

(1) Heat treatment temperature (°C.)
(2) Dipping treatment
(5) Additional treatment
A Degree of warp (mm)
B Adherence strength (kg/cm)

Analysis methods are as follows.

Dynamic elastic modulus ratio (E' 250° C. /E' 30° C.): a hardened substrate was prepared after removing copper foils from the surfaces of a thermally pressed copper-clad laminate, and the substrate was then cut to 3 mm width. The dynamic elastic modulus ratio (E') in the range of 20°–300° C. of the substrate was measured by a dynamic viscoelasticity measuring device (11 Hz and 3° C./min), so that a ratio of modulus at 30° C. and 250° C. was measured. In Table 1, E' 250° C./E' 30° C. is referred to as E1/E2.

Loss tangent (Tanδ) peak value: a hardened substrate was prepared after removing copper foils from the surfaces of a thermally pressed copper-clad laminate, and the substrate was then cut to 3 mm width. The dynamic elastic modulus ratio (E') and the loss modulus ratio (E") in the range of 20°–300° C. of the substrate were measured by a dynamic viscoelasticity measuring device (11 Hz and 3° C./min), so that a modulus ratio (Tanδ=E"/E') was measured. The modulus ratio is used as a peak value.

Degree of warp (mm): a hardened substrate was prepared after removing copper foils from the surfaces of a thermally pressed 20 cm×20 cm size copper-clad laminate, and the substrate was then placed on a board. The elevation at the four corners of the hardened substrate was measured as the degree of warp.

Adherence strength (kg/cm): a thermally pressed copper-clad laminate was cut to 1 cm width, and a peel test was carried out ninety times by a tensile tester. A scanning electron microscope (SEM) was used to measure adherence strength by examining whether or not the nonwoven fabric cloth peeled off from the matrix resin.

Conductivity (μS/cm): a hardened substrate was prepared after removing copper foils from the surfaces of a thermally pressed copper-clad laminate, and the substrate was pulverized into powder of less than 60 mesh. Five grams of the powder and 50 ml of pure water were added into a 100 ml sealed container made of polytetrafluoroethylene ("Teflon" manufactured by Dupont), and were treated at 121° C. for twenty four hours. The conductivity of this solution was measured by a conductivity meter.

The patterns on the copper foils of a copper-clad laminate were formed by etching, thus preparing a printed wiring board. The warp and twist of the printed wiring board are influenced mostly by the uneven quality of a substrate, but are also influenced by copper patterns. The degree of warp was measured by using a substrate where copper foils were removed by etching, so that the measurement was not influenced by copper patterns.

Table 3 shows a clear correlation between E1/E2, Tanδ and the degrees of warp. As E1/E2 becomes small, the degree of warp increases. When E1/E2 is large and close to 1.0 and Tanδ is closer to zero, a printed wiring board is thermally stable and does not change its size. The table also indicates that there is no uneven mechanical change in the process of manufacturing a prepreg and a copper-clad laminate. In order to keep the degree of warp 2.0 mm or less, it is preferable that E1/E2 is 0.7 or higher and Tanδ is 0.05 or less. As shown in Comparative Examples 3 and 4, conductivity increases as the amount of a water-based epoxy resin binder increases.

Table 4 shows the effects of the heat and dipping treatments. There is no difference in the degree of warp between a substrate treated with heat and one without the treatment, but the adherence strength improves when the heat treatment is carried out. The temperature of the heat treatment is preferably from 250° C. to 400° C. However, adherence strength decreases at 450° C. The heat treatment can also reduce conductivity. The crystallization of fibers by heat can prevent the elution of impurities. Like the heat treatment, the dipping treatment with methanol or ethanol is also effective in increasing the adherence strength. The heat treatment can be carried out along with the dipping treatment. The dipping treatment can clean the surface of fibers, and increase adherence strength. The dipping treatment is also effective with other solvents, such as ethanol, acetone and methylethylketone.

Table 5 shows the adherence strength when another, second treatment is carried out in addition to the heat treatment or the dipping treatment (first treatment). The adherence strength is enhanced by the silane coupling treatment, corona treatment or ozone treatment. These second treatments cannot increase the adherence strength by themselves, but can be effective when fiber surfaces are cleaned by the first heat treatment or dipping treatment.

The invention may be embodied in other forms without departing from the spirit or essential characteristics thereof. The embodiments disclosed in this application are to be considered in all respects as illustrative and not limitative, the scope of the invention is indicated by the appended claims rather than by the foregoing description, and all changes which come within the meaning and range of equivalency of the claims are intended to be embraced therein.

What is claimed is:

1. A prepreg comprising a nonwoven fabric cloth substrate, wherein said nonwoven fabric cloth substrate is impregnated with a resin varnish and is then dried, said nonwoven fabric cloth substrate comprising aromatic polyamide fibers, and having a 0.7–1.0 ratio of dynamic elastic moduli between 250° C. and 30° C. (E' (250° C.)/E' (30° C.)) as a dynamic viscoelasticity and a value of loss tangent (Tan δ) greater than 0 but less than 0.05 in a range of 30°–250° C.

2. The prepreg of claim 1 wherein the resin varnish comprises an epoxy resin.

3. The prepreg of claim 1, wherein the resin varnish comprises a phenol resin.

4. The prepreg of claim 1, wherein the nonwoven fabric cloth substrate comprises the resin varnish at 35–65 wt. % after being dried.

5. The prepreg of claim 1, wherein said prepreg has a thickness of 50–200 μm.

6. The prepreg of claim 1, wherein the nonwoven fabric cloth substrate is treated by at least one first treatment selected from the group consisting of a heat treatment at 250°–400° C. and a dipping treatment in an alcohol solvent before being impregnated and dried.

7. The prepreg of claim 6, wherein the nonwoven fabric cloth substrate is treated by at least one second treatment selected from the group consisting of a silane coupling agent treatment, a corona treatment and an ozone treatment after the first treatment and before being impregnated and dried.

* * * * *